United States Patent [19]

Fritsch

[11] Patent Number: 4,948,026
[45] Date of Patent: Aug. 14, 1990

[54] APPARATUS FOR MOUNTING AND/OR SOLDERING OR CEMENTING ELECTRONIC COMPONENTS, IN PARTICULAR SMD COMPONENTS, ON PRINTED CIRCUIT BOARDS

[76] Inventor: Adalbert Fritsch, Haus Nr. 46, D-8455 Kastl, Fed. Rep. of Germany

[21] Appl. No.: 340,123

[22] Filed: Apr. 18, 1989

[30] Foreign Application Priority Data

Apr. 19, 1988 [DE] Fed. Rep. of Germany ....... 3813096

[51] Int. Cl.$^5$ ............................................. B23K 37/047
[52] U.S. Cl. ...................................... 228/6.2; 228/49.1
[58] Field of Search ................. 228/6.2, 44.7, 47, 49.1, 228/180.2

[56] References Cited

U.S. PATENT DOCUMENTS

| 4,151,945 | 5/1979 | Ragard et al. | 228/6.2 |
| 4,696,096 | 9/1987 | Green et al. | 228/180.2 |

FOREIGN PATENT DOCUMENTS

| 63835 | 4/1982 | Japan | 228/6.2 |
| 63836 | 4/1982 | Japan | 228/6.2 |

*Primary Examiner*—Nicholas P. Godici
*Assistant Examiner*—Samuel M. Heinrich
*Attorney, Agent, or Firm*—Scully, Scott, Murphy & Presser

[57] ABSTRACT

An apparatus for mounting and/or soldering or cementing electronic components on printed circuit boards, having a first carrier for at least one circuit board and a second carrier for the component, the first and second carriers being displaceable relative to one another parallel to the plane of the circuit board and transverse thereto, and having a magazine for the components, is constructed so that before or after the component has been placed on the printed circuit board displacements of the component or its carrier in at least one of its coordinate directions (X, Y, Z) transverse to and/or along the printed circuit board can be avoided. To achieve this a respective brake is associated with the carrier displaceable parallel to the plane of the circuit board in two directions of displacement transverse to one another that is effective for movement in one of the two displacement directions (X, Y) or in both displacement directions (X,Y) and which can be operated as desired or is operated when there is contact between the displaceable carrier, the component and the circuit board, and/or when there is physical contact between the component and the circuit board, and/or a brake is associated with the carrier displaceable transverse to the plane of the circuit board to stop it in a position in which there is physical contact between the displaceable carrier, the component and the circuit board.

25 Claims, 6 Drawing Sheets

APPARATUS FOR MOUNTING AND/OR SOLDERING OR CEMENTING ELECTRONIC COMPONENTS, IN PARTICULAR SMD COMPONENTS, ON PRINTED CIRCUIT BOARDS

TITLE OF THE INVENTION

Apparatus for mounting and/or soldering or cementing electronic components, in particular SMD components, on printed circuit boards.

TECHNICAL FIELD OF THE INVENTION

The invention relates to apparatus for mounting and/or soldering or cementing electronic components, in particular SMD components, on printed circuit boards, having a first carrier for at least one circuit board and a second carrier for the component, the first and second carriers being displaceable relative to one another parallel to the plane of the circuit board and transverse thereto, and having a magazine for the components.

BACKGROUND OF THE INVENTION AND PRIOR ART

An apparatus of this kind is known in which the printed circuit board to be mounted is received in a first carrier and the components are removed from a magazine by means of a second carrier and placed on the printed circuit board. The second carrier includes a mounting tool arranged on a mounting head which can be displaced by hand in a horizontal cross guide parallel to the plane of the printed circuit board and in a vertical guide transverse to the plane of the printed circuit board, namely vertically, in order to be able to remove the respective component from the magazine and to place it on the printed circuit board. The mounting tool can be a suction needle connected to a vacuum source at the tip of which the components can be grasped by means of suction air. The suction needle can, when affixing the component carried by it on the printed circuit board, be displaced a short distance in its longitudinal direction and thereby operate a switch which switches the vacuum source off so that the component is released. In reverse the suction needle can, when the vacuum source is switched off, be placed on the component on the printed circuit board and be pressed on it whereby the micro-switch is actuated again and the vacuum source is switched on. By this means the component can be removed from the printed circuit board by the needle when it is free of its solder. When mounting a component on the printed circuit board the operator places the ball of the thumb of his hand holding the mounting head on a support provided on the apparatus. The operating hand therefore tends to carry out a curved movement when the mounting head is being lowered. This curved movement results in a slight lateral displacement of the component on the printed circuit board which is undesired in the last phase of lowering the mounting head, that is to say when the respective component has already reached the printed circuit board but the mounting head is lowered still further. With the high precision that is required today, in particular for placing SMD (small mounted device) components this can result in mis-wiring.

Lateral displacement of the component after being placed on the printed circuit board is also always possible owing to the more or less great instability of the operator's and mentioned above, in particular in the case of inexperienced operators. It requires considerable attention and effort to hold the mounting head after the component has been placed on the printed circuit board, particularly if this holding requires a long time, which often occurs when repairing printed circuit boards.

A further problem in an apparatus of the kind described in the introduction, in which the carrier is subjected to biassing directed upward which when released by the operator's hand takes it back to its upper starting position, consists in that the operator's hand is bound to the carrier while the component is being pressed on to the printed circuit board. This is true of both mounting operations and of repair work on mounted printed circuit boards in which defective components are to be removed or unsoldered from the printed circuit board and replaced by good components. Because the operator's hand is bound to the carrier displaceable transverse to the plane of the printed circuit board the so-called work of the operator can only be carried out with difficulty.

OBJECT OF THE INVENTION

It is an object of the invention to design an apparatus of the kind mentioned in the introduction so that before and after the component is placed on the printed circuit board displacement transverse to and/or along the printed circuit board of the component or its carrier is prevented in at least one of the coordinate directions.

SUMMARY OF THE INVENTION

This object is achieved as set forth in claim 1.

In the arrangement according to the invention a brake is associated with the carrier displaceable parallel to the plane of the printed circuit board in at least one of its two directions of displacement which can be operated as desired or is operated when the component held by the carrier touches the surface of the printed circuit board to be mounted. After being operated, displacement of the component can no longer occur even if the carrier is moved further downwards in order to press the component on to the printed circuit board. If the movement is only arrested in one coordinate direction components can be placed in a row in the other coordinate direction.

The invention also makes possible an arrangement in which constant holding with the hand is not required to maintain the simultaneous contact of the component placed on the printed circuit board with the carrier and the printed circuit board.

For this purpose a further brake may be associated with the carrier displaceable transverse to the plane of the printed circuit board which makes arresting the carrier in the lowered position possible. Thus it is possible to maintain the simultaneous contact of the component with the carrier and the printed circuit board without the operator having to use his hand to do this. This is true both when placing a component to be mounted on the printed circuit board and when removing a component from the printed circuit board. By operating the brake the carrier can be fixed in the arrested position without it having to be held by the operator. The operator therefore has both hands free to carry out attaching or removing operations or soldering and unsoldering work, and thus can guide the solder with one hand and a soldering iron or a hot-air apparatus with the other. By using a soldering iron instead of hot air the following disadvantage will also be avoided. In the case of repair work on mounted printed circuit boards in which defective components are to be unsoldered from the printed circuit board and replaced by good components hot air was formerly often used to unsolder and resolder the components. However, particularly when resoldering functioning components it has been found that the hot air leaves sphere-shaped particles or residues of soldering and/or fluxing agents at the mounting point, namely beneath the new component to be affixed whereby short circuits may arise or other disturbances can be caused (for example effects on capacitances or inductances). In the arrangement according to the invention the operator can use a soldering iron in a comfortable manner, whereby the disadvantages described above can be eliminated.

The features set forth in claims 2 to 24 are characterized by a simple and economical to manufacture and small design for reasons of simple operation and for functional reasons. It is advantageous to provide brakes acting in both directions of displacement running parallel to the plane of the printed circuit board so that the operator is not only relieved or freed in one displacing or coordinate direction but in both directions. This is particularly true of the direction of displacement which lies in the line of sight of the operator and in which control of the exact position of the mounted component is made difficult.

Within the scope of the invention it is also possible to operate the brake acting in the direction of displacement running transverse to the plane of the printed circuit board manually or automatically, e.g. by a switch. Manual operation is advantageous because on the one hand the brake can be operated as desired, which is advantageous for particular mounting or repair work, and on the other hand certain manually produced pressure moments can be used which improve fixing the component in position on the printed circuit board by means of the carrier.

BRIEF DESCRIPTION OF THE DRAWINGS

The invention will now be explained in more detail with reference to exemplary embodiments shown in simplified drawings, in which.

DETAILED DESCRIPTION OF PREFERRED EMBODIMENTS OF THE INVENTION

Figure 2:
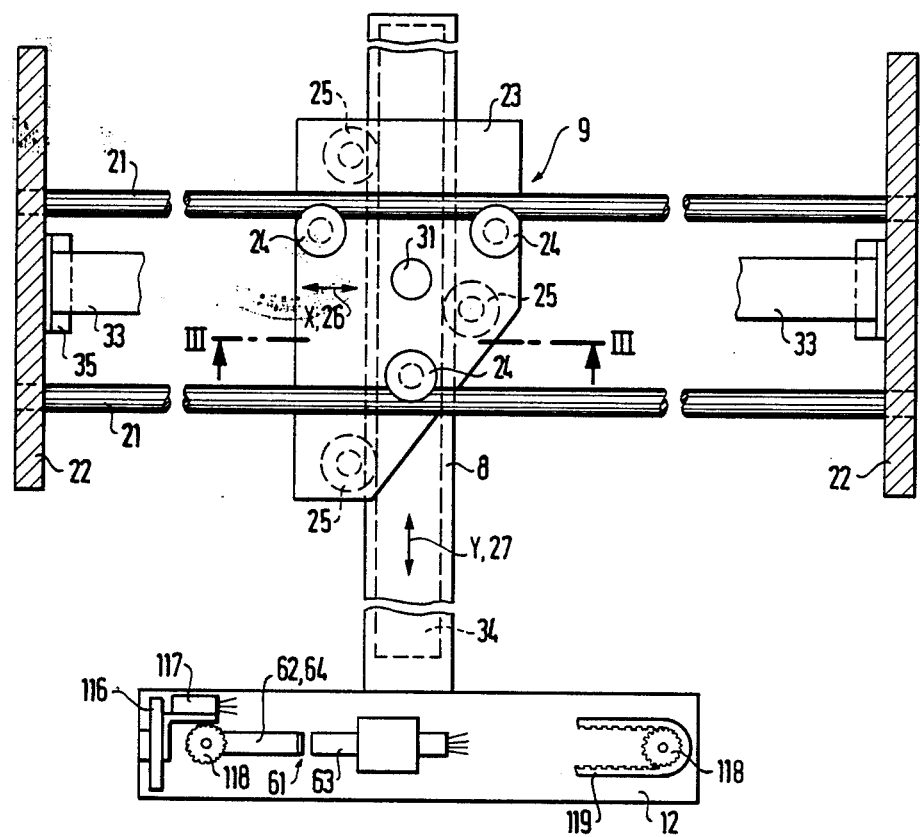
FIG. 2 shows a cross-guide for a guide arm of the device carrying a tool head in a plan view.

The essential parts of the device in the form of a manipulator, generally indicated by 2, are a frame 3 for supporting printed circuit boards 4, which relative to the operating side 5 of the device 2 is arranged at the front, a bridge-shaped guide part 6 offset towards the rear relative to the supporting frame 3 and extending parallel to the operating side 5, having attached to the underside of its horizontal crossbeam 7, in a cross guide 9 shown in FIG. 2, a guide arm 8 mounted to be displaced substantially at right angles to and parallel to the operating side 5, a mounting head 12 arranged on the end of the guide arm 8 facing the operating side 5 and having a handle 13 which the operator grips in order to displace the guide arm 8 as desired parallel to the plane of the printed circuit board 4, a magazine 14 for electronic components 15 arranged, in the present exemplary embodiment, to the left of the supporting frame 3, and a tray 16 arranged to the right of and next to the supporting frame 3 which for adaptation to printed circuit boards 4 of different sizes is displaceably guided on a frame 17 that carries the supporting frame 3 and on which the hand of the operator guiding the mounting head 12 can be placed.

To the front of the crossbeam 7 the control elements determining the functioning of the device are arranged.

The motion coordinates of the guide arm 8, on which the mounting tool, which in this exemplary embodiment is a suction needle 18, carried by the tool head 12 can be displaced in the plane of the printed circuit board 4 at each point in the coordinate system, i.e. at each point on the printed circuit board, are indicated by X and Y.

A further vertical direction of movement Z is provided for the mounting tool which in the present exemplary embodiment comprises a vertical guide 19 (FIG. 4) between the guide arm 8 and the mounting head 12.

The essential parts of the cross-guide 9 shown in FIG. 2 are two guide rails 21 in the form of circular rods which extend parallel to the X axis in a horizontal plane and are attached to the side walls 22 of the guide part 6, a guide plate 23 which extends between the guide rails 21 and the guide arm 8 (FIG. 3), and sets of three guide rollers 24, 25 of which the guide rollers indicated by 24 cooperate with the guide rails 21 and form the X-guide 26, while the guide rollers indicated by 25 cooperate with the guide arm 8 and form the Y-guide 27. As can be seen in particular in FIG. 3 the guide rollers 24, 25 have an X-shaped outer surface with which they engage over the guide rails 21 and the laterally rounded guide arm 8 so that the guidance is secured in the horizontal plane. The guide arm 8 comprises a flattened tube, i.e. it has flat upper and lower sides and rounded side surfaces. The guide rollers 24, 25 clasp the guide rails 21 and the guide arm 8 respectively at three points, whereby exact guidance is ensured in a simple manner.

Associated with the cross-guide 9 are two brakes 28, 29 of which the brake 28 makes it possible to block as desired the movement of the guide plate 23 in the X-direction and the brake 29 makes it possible to block the movement of the guide arm 8 in the Y-direction. The brakes 28, 29 are electromagnetic brakes each having a respective electromagnet 31, 32 and an associated braking element, which in the present exemplary embodiment is rod-shaped, namely a metal strip 33, 34 of ferromagnetic material which extends along the X- or Y- direction. The brakes 28, 29 can be seen in detail in FIG. 3. The metal strip 33 of the X-brake 28 is attached to the side walls 22 by means of fastening brackets 35 while the metal strip 34 of the Y-brake is attached to the underside of the guide arm 8 preferably by screws arranged at the free ends of the metal strip 34. The metal strips 33, 34 each comprise two flat strips arranged over one another between which is an insulating layer or an insulating strip of soft or ductile or elastic material. In the present exemplary embodiment a double-sided adhesive strip, preferably of plastics material or paper is used and preferably stuck to the flat strips 36. Hereby vibrations and the production of acoustic tones when the brake acts are prevented.

Since the metal strips 33, 34 do not yield in their longitudinal direction or are held so that they do not yield, operation of the brake 28, 29 by closing an electric circuit (not shown) which includes the associated electromagnet 31, 32 results in exact positioning of the guide arm 8 or of the mounting head 12 in the respective direction of movement. It is also important that the electromagnets 31, 32 are each arranged on the underside of the respective associated metal strip 33, 34 whereby interference to the operation of the brakes 28, 29 caused by dirt is prevented. In the present exemplary embodiment the electromagnet 31 of the X-brake 28 is arranged on the guide plate 23 while the electromagnet 32 of the Y-brake 29 is arranged beneath the guide arm 8 on a U-strap 38 gripping thereunder which is attached to the underside of the guide plate 23 by screws.

The mounting tool formed by the suction needle 18 is displaceable in the vertical Z-guide, indicated generally by 19, by vertically displacing the mounting head 12. Furthermore the suction needle 18 is displaceable, preferably by only a few millimeters, in the mounting head 12 in a vertical guide indicated by 39, as indicated by the double arrow $Z_1$.

Both vertical guides 19, 39 are roller bearing guides and are thus of high precision. The Z-guide 19 has a vertical circular guide rod 43 which is displaceable with a roller bearing cage in a vertical guide piece 44 attached to the guide arm 8. In order to prevent horizontal rotation of the mounting head 12 about the guide rod 43 a second vertical guide rod 45 is arranged in the box-shaped housing 46 of the mounting head 12, which is likewise precisely clasped in a fork-like manner by a lateral projection 47 on the guide piece 44. By means of a leaf spring 48 acting between the guide piece 44 or its attached parts and the housing 46 the mounting head 12 is urged towards its upper end position.

The vertical guide 19 likewise has associated with it a brake, generally indicated by 51, which is likewise an electromagnetic brake having an electromagnet 52 arranged in an electric circuit (not shown) and a braking surface of ferromagnetic material, which in the present exemplary embodiment is likewise arranged on a metal strip, which is held movably along the electromagnet 52 so that the latter can be arranged non-movably. In the present exemplary embodiment the electromagnet 52 is attached to a support 54 which is attached to the projection 47 extending from the guide piece 44. The metal strip is a small plate 53 which is secured in a vertical position to the side wall 56 of the housing 46 by means of a leaf spring 55 attached to it so that it can be deflected along the electromagnet 52 so as to lie without a gap against its front end when the electromagnet 52 is energized. In all the brakes 28, 29, 51 the arrangement is such that there is a small air gap between the electromagnets 31, 32, 52 and the associated metal strips 33, 34 or small plate 53. This prevents grinding noises when the mounting head 12 is displaced in the released condition of the brake.

In the present exemplary embodiment the mounting tool formed by the suction needle 18 has, on the upper side of the mounting head 12, a switch 61 (FIG. 6) which is activated near the highest position of the suction needle 18 in the direction of movement indicated by $Z_1$. This is a so-called transmission switch, so as to ensure that the switching is performed with the smallest possible movement of the suction needle 18 in the $Z_1$ direction of movement. The switch 61 is a proximity switch having a movable switching element 62 and a stationary switching element 63. The movable switching element 62 is in the form of a lever 64, here with one arm, mounted to pivot vertically at 65, which is urged by means of a spring, preferably a leaf spring 66, into its contact position with the stationary switching element 63. The suction needle 18, which normally occupies its lower position due to its own weight or to spring action, normally pushes with an operating member 67 on the lever 64, whereby the switch 61 is opened. As soon as the suction needle 18 is marginally lifted the switch 61 is closed by means of the leaf spring 66. Since the distance a of the suction needle 18 from the bearing point 65 of the lever 64 is much smaller than the length l of the lever 64, preferably only about 1/5 of the length 1, even a small vertical movement of the suction needle 18 is enough to actuate the proximity switch 61.

Associated with the mounting head 12 in the region of the Z-guide 19 is a second switch 71, indicated in outline (FIG. 4), which in a region between the lowest and the highest position of the mounting head 12 (preferably in the middle region) between these positions prevents the brakes 28, 29, 51 from operating. This switch is operated by two guide pieces of the Z-guide displaced relative to one another, here by the housing 46 to which the switch 71 is attached and the guide piece 44.

The magazine 14 includes a magazine rod 81 in the form of a profiled rail having plurality of magazine boxes 82 which—since the present device is intended for mounting small SMD components 15—are relatively small. They are magazine boxes 82 that can be opened and closed as desired by means of a lid, preferably a hinged cover 83, and which are only opened for the short period needed for mounting. This avoids components 15 unintentionally getting into the wrong magazine boxes 82, and thus prevents incorrect mounting due to this cause.

The magazine 14 is arranged near the supporting frame 3 for the printed circuit boards 4 so as to avoid as far as is possible long transport paths for the components 15 between the magazine 14 and the printed circuit board 4. In the present exemplary embodiment the magazine 14 is located to the left next to the supporting frame 3. It could, however, also be arranged to the right next to and/or in front of or behind the supporting frame 3.

To support the magazine 14, here the magazine rod 81, a magazine holder 84 is arranged on the frame 17 which, like the supporting frame 3, has two horizontal supporting strips 85 of which one is preferably in either the form of a clamping strip 86 or includes such a strip. The magazine rod 81 is inserted between the supporting strips 85 and is held resiliently by means of the clamping strip 86. The arrangement is such that the bottom 87 of the magazine boxes 82 is located approximately at the height of the supported printed circuit board 4.

In each case the hinged lid 83 at the top of the respective magazine box 82 is pivotably mounted about a substantially horizontal hinge 88 on the side of the magazine box 82 facing away from the printed circuit board 4, and has on the side facing the printed circuit board 4 a fastening mechanism, preferably in the form of a latch 89. This latch 89 can be opened manually, preferably with the aid of the mounting tool, here the suction needle 18. The latch 89 has a catch 91 which in the present exemplary embodiment is arranged on a substantially vertical latch arm 92 which can be moved from its engaged position by pushing away laterally and restored by spring force, or preferably elastically, to its engaged position, where it engages with its catch 91 over a locking edge or surface on the hinged lid 83, here the upper side. In the present exemplary embodiment the catch 91 has on its upper side an inclined surface 93 which is inclined towards the side facing away from the printed circuit board 4. The latch 89 can thus be opened by the suction needle 18 either by a vertical movement downwards or a horizontal movement of the suction needle 18 towards the printed circuit board 4 by pressing against the catch 91. After the catch 91 is released the hinged lid 83 automatically springs upwards like a spring lid.

In order to make opening by means of the suction needle 18 easier the hinged lid 83 has, near the catch 91 and on its side facing away from the printed circuit board 4, a recess 94 which is narrower than the catch 91 so that the latter can engage over the rims of the recess 94.

The magazine boxes 82 preferably consist of plastics material. In the present exemplary embodiment the latch arm 92 is formed integrally with the associated side wall of the magazine box 82, preferably in the form of a double-armed lever, so that the catch 91 is operated as desired by loading the upper or lower lever arm 92.1 (tensile or pressure operation). In the present exemplary embodiment the middle of the latch arm 92 is connected to the side wall 95 by connecting pieces 96, about which it is pivotable in the sense of a hinge 97 with a horizontal axis. In order to ensure free pivotability, recesses 98, 99 are provided on the inside of the latch lever and laterally thereof. The magazine box 82 is an injection molded plastics material part.

On the underside of the magazine box 82 are claw-shaped clamping elements 101 having clamping lugs 102 which engage behind lateral undercuts on the magazine rod 81. The undercuts are formed by inclined surfaces 103 which, owing to their inclined position, makes easy removal of the magazine boxes 82 possible by simply pulling them gently upwards and pressing the clamping elements 101 outwards. In order similarly to facilitate clipping the magazine boxes 82 on to the magazine rod 81 further inclined surfaces 104 in the form of a roof are arranged on the upper side of the inclined surfaces 103 by means of which the clamping elements 101 are pressed apart when clipping on.

In the present exemplary embodiment the magazine boxes 82 are arranged in one row by means of a magazine rod 81. It is also possible to arrange the magazine boxes 82 or magazine rods in two or more rows, in which case a corresponding number of magazine holders 84 would have to be provided.

In order to mount components on a printed circuit board 4 it is held in the supporting frame 3. The supporting frame 3 has for this purpose two further supporting strips 85 extending transverse to the operating side 5, of which the left holding strip is rigid and the right holding strip 85 is displaceable in a guide extending parallel to the operating side 5 or on a guide rail 113 forming this guide, and can be secured as desired by means of a securing screw 120. The upper edges of the holding strips 85 are stepped as mirror images of one another so as to form supports for the printed circuit board 4 and limiting bars engaging laterally over it.

Figure 1:
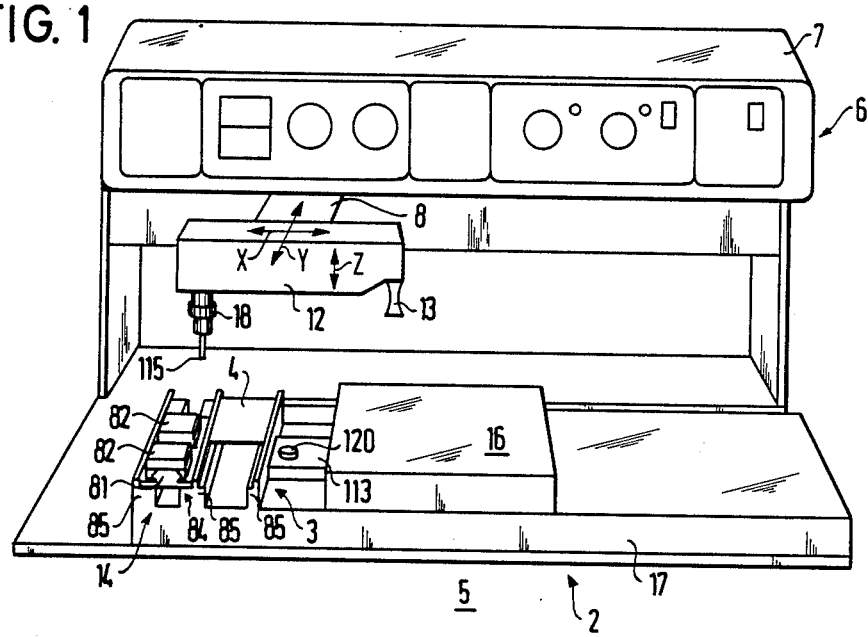
FIG. 1 shows a device designed according to the invention for mounting and/or soldering or cementing electronic components on printed circuit boards in a perspective view from the front.
Figure 7:
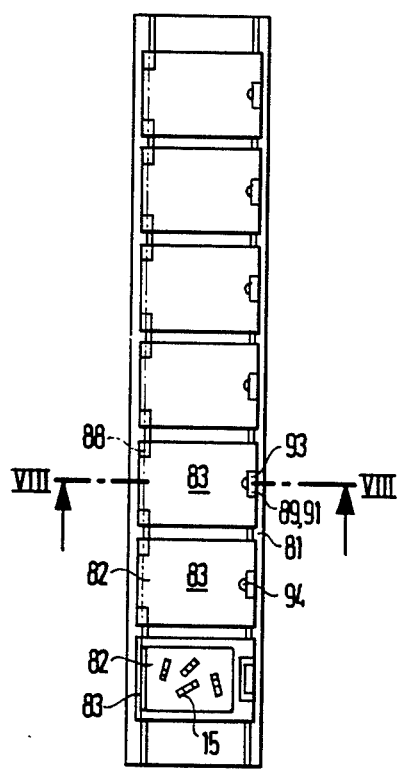
FIG. 7 shows a magazine for the device in a plan view.

In the present exemplary embodiment the mounting tool on the mounting head 12 is a suction needle by means of a which a component 15 is removed from the magazine 14 and deposited on the printed circuit board 4 at the predetermined point. For this purpose after switching on an air-suction pump (not shown), which is connected to the suction needle 18 by means of a hose connection the suction needle is guided to the magazine box 82 containing the predetermined component 15: for simplicity only two boxes 82 are shown in FIG. 1. The movement of the suction needle 18 is effected by displacing as desired the mounting head 12 in the three directions of movement X, Y, Z already described. Opening the predetermined magazine box 82 is done by means of the suction needle 18, for which purpose the latter is displaced either downwards from above against the inclined surface 93 or from the side against the catch 91 or the latch arm 92. As soon as the latch is released the hinged lid 83 concerned springs open and the suction needle 18 can be lowered into the opened magazine box 82 to pick up a component 15 by means of the air suction at the suction tip 115 of the suction needle. The suction needle is then moved over the printed circuit board 4, and by displacing the mounting head 12 downwards is placed on the specific point where the component is to be mounted. As soon as the component 15 is placed on the printed circuit board 4 a relative movement between the suction needle 18 and the mounting head 12 is effected by a further small displacement of the mounting head 12 downwards, the mounting head being displaced downwards relative to the suction needle 18. This movement causes the switch element 62 to be moved upwards by the suction needle 18, thus closing the switch 61 which causes the brakes 28, 29 to operate and cuts off the suction air from the suction needle 115. The operation of the brakes 28, 19 fixes the suction needle 18 in position in the horizontal plane so that lateral displacement or slipping out of this mounting position is no longer possible.

Operation of a tiltable switch member 116 of a switch 117, which in the present exemplary embodiment is also located on the top of the mounting head 12, above the suction needle 18, also actuates the third brake 51, so that the suction needle 18 is held in position in all directions of movement X, Y and Z. In this position the suction needle performs the function of supporting the component located between its tip and the printed circuit board. This is of particular advantage in cases in which the component is to be fixed to the printed circuit board 4 by a further manual operation, for example soldering or cementing. Because the suction needle 18 is also held in the vertical Z direction of movement, the mounting head 12 no longer needs to be held by hand, so that the operator has both hands free, for example to guide the solder with one hand and a soldering iron with the other.

Further manual operation of the switch member 116 enables the switch 117, and thus also the brake 51 that acts in the vertical Z direction of movement, to be switched off, so that the mounting head can be raised, or is raised by the force of the leaf spring 66. At the same time, i.e. by the resulting relative movement between the mounting head 12 and the suction needle 18, the operation of the switch 61 is ended and thus the brakes 28, 29 are also released, so that a new mounting or repair operation can take place. The connection of the suction air to pick up a component from the printed circuit board 4 (repair) or a next component 15 from the magazine 14 occurs automatically by slight pressure of the suction needle 18 against the component, whereby the switch 61 is operated and the suction air is connected.

Figure 8:
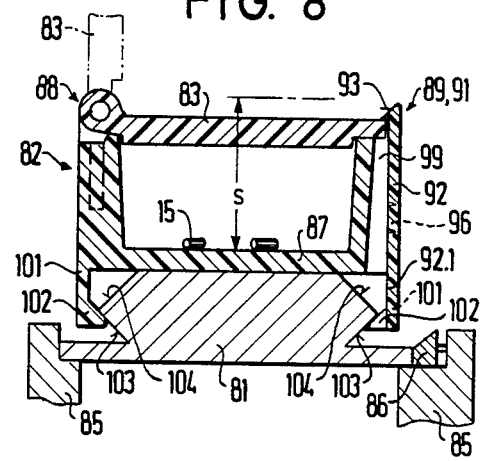
FIG. 8 shows the section on the line VIII—VIII in FIG. 7.
Figure 9:
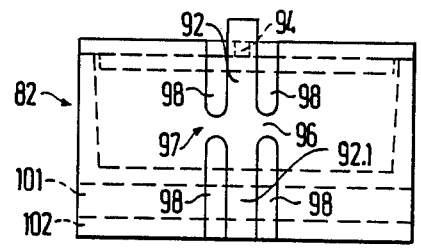
FIG. 9 shows a magazine box of the magazine in side elevation.

In opening the lid 83 the suction needle is generally pushed in and the switch 61 operated. To prevent the brakes 28, 29 being engaged in this case, the switch 71 that controls this must be set at the position S (FIG. 8) that is determined by the height of the magazine box. In other words, in the present exemplary embodiment the engagement of the brakes 28, 29 and the turning off of the suction air is only possible when the switch 71 is operated, i.e. in the lower region of the Z movement.

Figure 4:
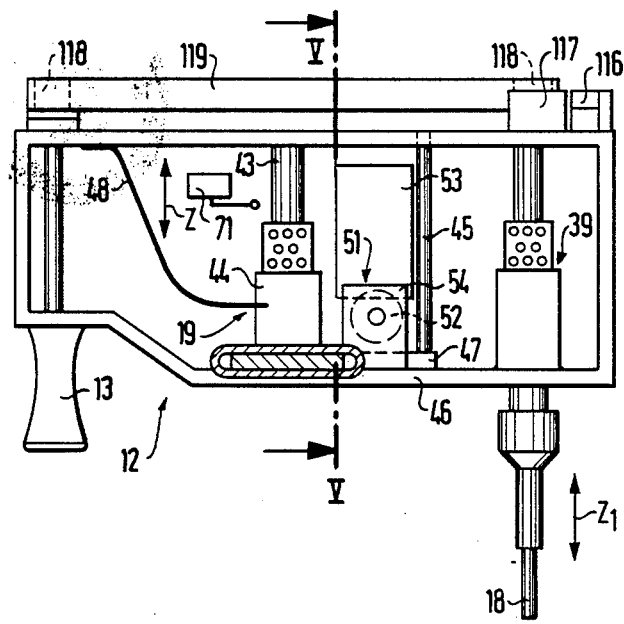
FIG. 4 shows a rear view of the opened tool head.
Figure 5:
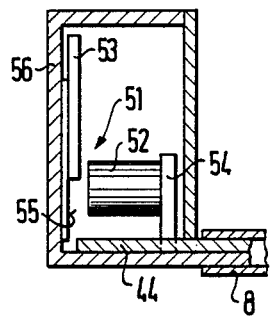
FIG. 5 shows a section on the line V—V in FIG. 4.
Figure 6:
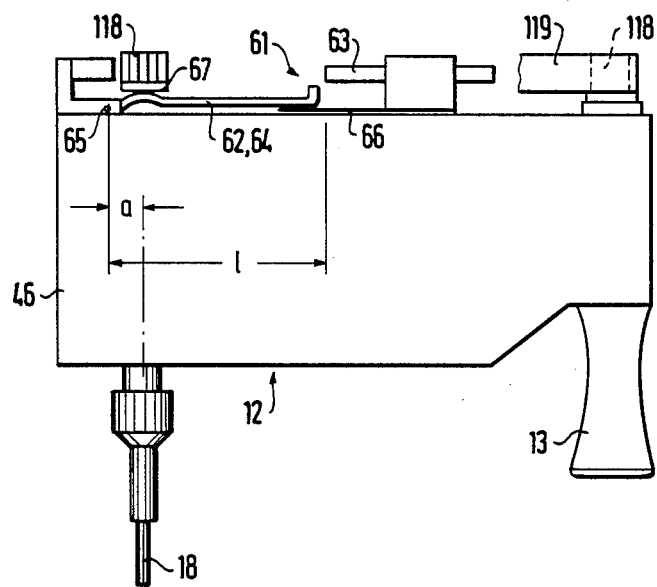
FIG. 6 shows the tool head in front elevation.

As can be seen from FIGS. 2, 4 and 6, the suction needle 18 and thus also the component 15 that it carries can be turned as desired about the longitudinal axis of the suction needle. For this purpose both the suction needle 18 and the handle 13 are mounted to turn about its vertical axis in the mounting head and a turning drive, preferably a belt drive with belt pulleys 118 and a belt 119, preferably a toothed belt, is provided between the upper ends of the suction needle 18 and the shaft of the handle 13 that passes through the mounting head 13.

Figure 10:
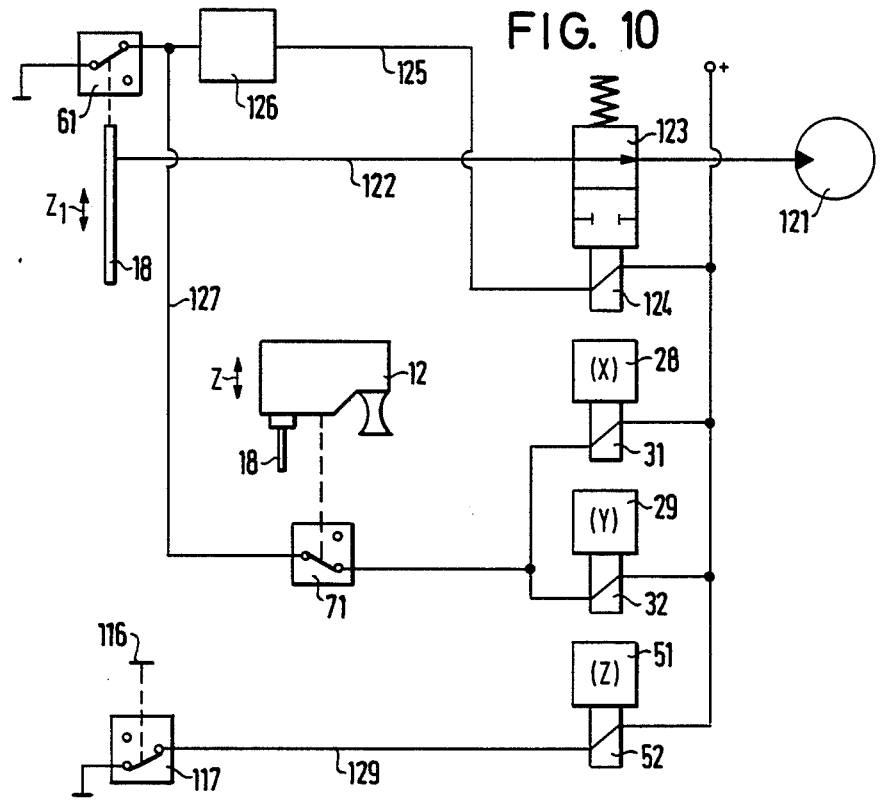
FIG. 10 shows an electric circuit diagram for the device.

As is shown by the circuit diagram in FIG. 10, an electromagnetically operated shut-off valve 123 is arranged in the suction line 122 leading from a source of vacuum 121 to the suction needle 18, with its electromagnet 124 connected by an electrical lead 125 to the switch 61 and also—depending on whether the circuit is a simple electric circuit or an electronic circuit—to a changeover switch 126 or a flip-flop. By this means successive operations of the switch 61 switch the changeover switch 126 alternately on and off. Branching off between the switches 61 and 126 is an electrical lead 127 in which the switch 71 is arranged and in the further course of which the electromagnets 31 and 32 of the brakes 28 and 29 are arranged. The circuit diagram shows the suction needle 18 in the raised position (main switch 61 is closed) and the mounting head 12 in the lowered position, so that the brakes 28, 29 can be engaged. In the raised position of the mounting head 12 engagement of the brakes 28, 29 is, as desired, not possible. Engagement and disengagement of the brakes 28, 29 thus depends first on the switch 71 and second on the switch 61, and is independent of the position of the changeover switch 126. In contrast to this, the brake 51 that acts in the vertical Z direction of movement can, as desired, be engaged and disengaged by manual operation of the switch 117 independent of the operating situations described above. The electromagnet 52 of the brake 51 is located in an electrical lead 129 leading from the switch 117.

Figure 11:
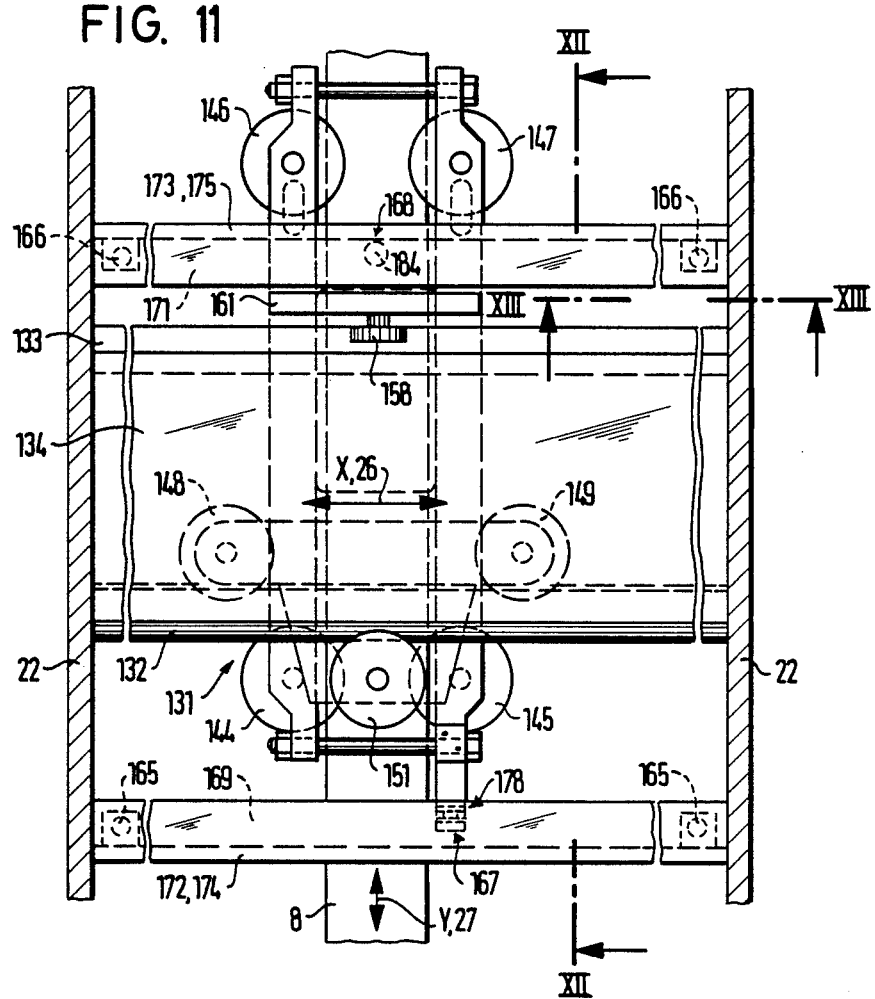
FIG. 11 shows a magazine as a modified exemplary embodiment.
Figure 12:
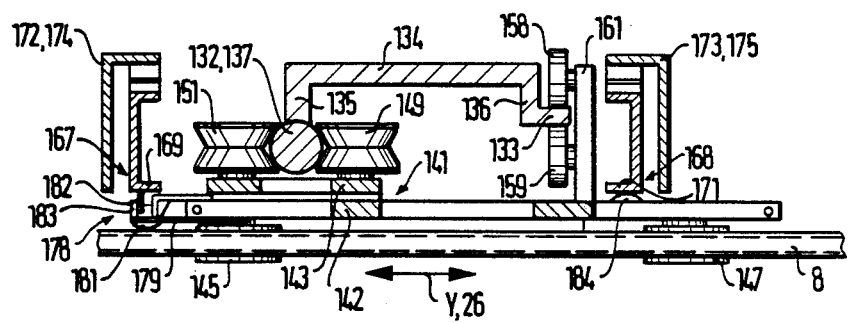
FIG. 12 shows the section XII—XII shown in FIG. 11.
Figure 14:
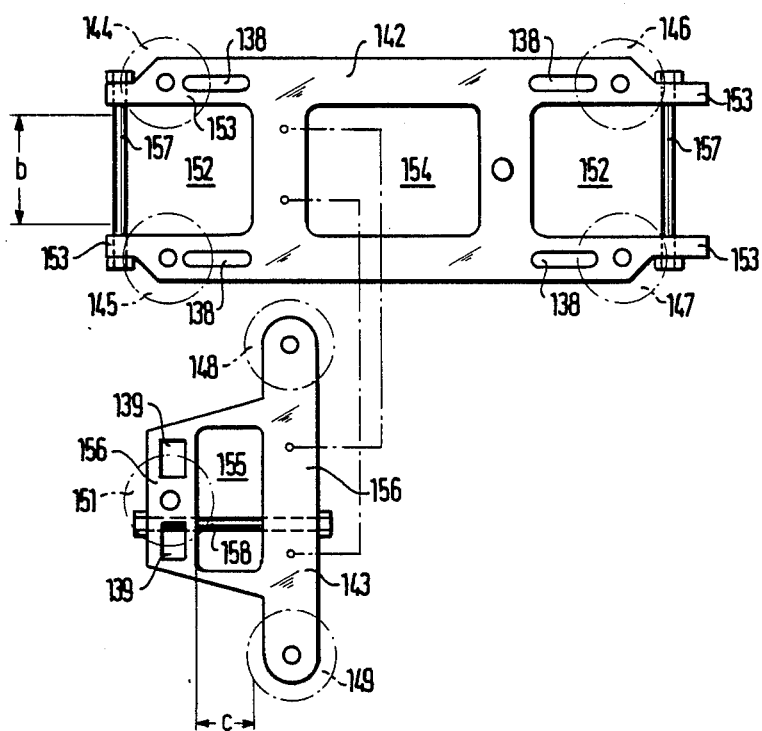
FIG. 14 shows a cross carriage as a detail.

In the exemplary embodiments shown in FIGS. 11 and 12 the cross guide, generally indicated by 131, has a main guide rail 132 and an auxiliary guide rail 133 for guiding the mounting head 12 and its guide arm 8 in the X-direction, which extend horizontally and parallel to the operating side 5 of the apparatus 2 at a distance from one another between the side walls 22 and are attached thereto in a manner not shown. The guide rails 132, 133 are arranged on a common guide profile 134, also extending between the side walls 22, whose downwardly pointing profile limbs 135, 136 carry the guide rails 132, 133. The main guide rail 132 is a circular rod 137 which sits in a groove in the underside of the front vertical limb 135 and is screwed thereto. The auxiliary guide rail 133 is formed by a profile limb projecting horizontally backwards from the rear profile limb 136. The cross carriage 141 carrying the guide rollers is in two parts having a lower, substantially H-shaped carriage plate 142, which carries 4 guide rollers 144 to 147 which clasp the guide arm 8 with V-shaped peripheral grooves and guide it in the Y-direction, and a frame-shaped carriage plate 143 arranged on the carriage plate 147 which carries three guide rollers 148 to 151 which clasp the circular rod 137 likewise with V-shaped peripheral grooves and are mounted to rotate freely on axes pointing upwards from the carriage plate 143, the guide roller 151 being arranged on one side of the circular rod 137 is arranged centrally of the other two guide rollers 148, 149. Owing to cut-outs 152 and slots 138 in the limbs 153 of the carriage plate 142 and a central cut-out 154 and slots 150 in a web part of the carriage plate 142 and owing to the recess 155 in the frame-shaped carriage plate 143 and the slots 139 on either side of the axis of the guide roller 151 the guide distances b, c can be set by means of tensioning bolts 157, 158, one connecting the opposite limbs 153 of the carriage plate and one connecting the opposite frame bar 156 of the carriage plate 143. Furthermore the weight and mass of the carriage plates 142, 143 is greatly reduced. In FIG. 14 the carriage plates 142, 143 are shown as details unassembled.

The auxiliary guide rail 133 extends between two guide rollers 158, 159 arranged over one another which are mounted by means of horizontal axles transverse to the guide rail 133 on an upright bearing limb 161 which is attached to the carriage plate 142.

The guidance in the X-direction described above has satisfactory stability. It is not possible, as in the first exemplary embodiment, to push the guide rails 132, 133 apart, whereby the guidance is considerably impaired. In addition the guide profile 134 contributes to stabilizing the side walls 22 in a box structure.

Figure 3:
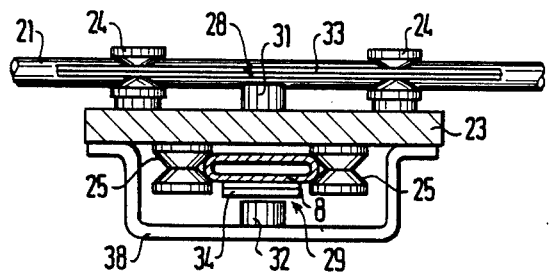
FIG. 3 shows a first brake and a second brake for the guide arm in part section on the line III—III in FIG. 2.

In the arrangement shown in particular in FIGS. 2 and 3 the brakes 28, 29 are components of the guide plate 23. As a result manipulation of the mounting head 12 is made considerably difficult by the inertia of the electromagnets 31, 32. Furthermore electric leads to the electromagnets must be provided and also be moved whereby manipulation is made more difficult.

In the exemplary embodiment shown in FIGS. 11 to 14 the electromagnets 165, 166 of the brakes, indicated by 167, 168, for the X- and Y-directions of movement of the mounting head 12 are apart from the movable parts of the cross guide 131 and stationary. This is achieved by brake rails 169, 171 extending parallel to the guide profile 134 of which one can arrest the cross carriage 141 (X-movement) and the other the guide arm 8 (Y-movement).

In the exemplary embodiment shown in FIGS. 11 to 14 the brake rails 169, 171 extend parallel to the guide profile 134 and are arranged before and after the latter, and are each held by cross beams 172, 173 extending transverse to the side walls 22 and attached to the side walls 22 in a manner not shown. The cross beams 172, 173 comprise angle rails 174, 175 whose horizontal limbs are arranged on the top. The brake rails 169, 171 are U-rails whose limbs extend horizontally and whose lower side area forms the braking surface. As can clearly be seen, in particular in FIG. 12, the front brake rail 169 is closely above a brake part 178 which is attached to a vertically elastically reboundable brake arm 179 (leaf spring), preferably having two arms, projecting horizontally from the carriage plate 142 so that in its normal position it lies with a hard rubber-like pressure piece 181 arranged on its underside closely above the guide arm 8. As soon as the brake rail 169 is lowered the pressure piece 181 is pressed against the upper side of the guide arm 8, as a result of which braking is caused between the cross carriage 141 and the guide arm 8. Because the brake rail 169 extends parallel to the guide rails 132, 133 the brake part 178 can be operated in each position of the X-movement by the brake rail 169. In the present exemplary embodiment a small roller 182 is mounted on the brake part 168 in a forked head 183 to rotate freely about an axis parallel to the Y-direction of movement whereby when braking stresses acting in the X-direction of movement, and the inaccuracies thus resulting, are avoided.

The brake rail 171 arranged behind the guide profile 134 also extends parallel to the guide profile 134 and cooperates with a brake part 184 which is likewise a hard rubber-like piece and is attached to the lower carriage plate 142. By means of this brake 168 movements of the cross carriage 141 in the X-direction are arrested. Because the brake rail 171 extends parallel to the X-direction the brake part 184 is likewise operable by the brake rail 171 in each position of the X-movement of the cross carriage 141.

Figure 13:
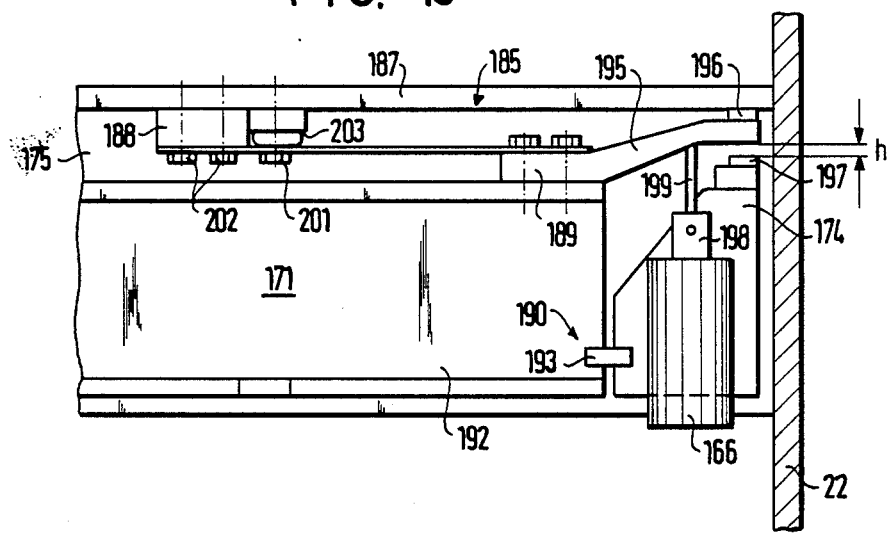
FIG. 13 shows the partial section XIII—XIII shown in FIG. 12.

Each brake rail 169, 171 is displaced vertically by two electromagnets 165 or 166 engaging at their ends so as to bring about the braking action or its release. In FIG. 13 this is shown in connection with a vertical guide having little friction for the brake rail 171 at its right end. This vertical guide 185 has a leaf spring 186 extending horizontally which, by means of bearing blocks 188, 189 attached by screws to the underside of the horizontal limb 187 of the angle rail 175 and to the upper side of the brake rail 171, is held in a horizontal position between the angle rail 175 and the brake rail 171. By this means the end of the brake rail 171 concerned is held in the horizontal plane without movement and can be slightly displaced vertically due to the slight resilience of the leaf spring 186. Since the leaf spring 186 slightly resists torsion about its longitudinal axis a lateral guide 190 is provided at the lower end of the brake rail 171 which is formed by a fork 193, clasping the web 192 of the brake rail 171, on a bearing piece 194 carrying the associated electromagnets 166 and attached to the vertical limb of the angle rail 175. Extending from the bearing blocks 189 is a stop arm 195 between padded stops 196, 197 for the vertical movement of the brake rail 171. The stop 196 is formed by a damping element on the horizontal limb 187 of the angle rail 175, while the stop 197 is a damping element on the bearing part 174 which is a plastics material part. The attracting armature 198 of the associated electromagnet 166 is connected to the stop arm 195 by a tension rod 199 which in the present exemplary embodiment forms an integral plastics material part with the tension rod 199 and the bearing blocks 189. The stroke of the brake rail 171, now amounting to very little, is indicated by h.

The vertical spring force of the leaf spring 186 can be set simply and without trouble by a set screw 201 which is arranged on the side facing the free end of the leaf spring 186 by securing screws 202 fixing the leaf spring 186 to the angle rail 175. The head of the set screw 201 preferably presses the leaf spring 186 against a rubber pad which is arranged in a recess 203 in the bearing block 188. Thus, the leaf spring 186 is prevented from vibrating. The spring force is made large enough for it to pull the brake rail 171 against the upper stop 196. The associated electromagnet 166 thus only needs to exert tensile stress to cause braking and thereafter the brake rail 171 is pulled back or up by the leaf spring 186. The arrangement and function of the other end of the brake rail 171 is the same as that of the other brake rail 169.

In the exemplary embodiment shown in FIGS. 11 to 14 the brakes 167, 168 and the electromagnet pairs 165, 166 are each operable independently, i.e. separately, by a respective switch (not shown) such as a side switch or foot switch. Hereby it is ensured that the components to be mounted can be placed on the printed circuit board as desired exactly in only one of the two coordinate direction (X, Y). The two brakes 167, 168 of this exemplary embodiment and also the two brakes 28, 29 of the first exemplary embodiment should be operable together as desired by a switch, in particular a foot switch, namely as desired independently of contact between the component 15 and the printed circuit board 4 or the switch 61 as shown in FIG. 10.

What is claimed is:

1. An apparatus for mounting and soldering or cementing SMD components on printed circuit boards, having a first carrier for at least one circuit board and a second carrier for the component, the first and second carriers being displaceable relative to one another parallel to the plane of the circuit board and transverse thereto, and having a magazine for the components, wherein said second carrier, displaceable parallel to the plane of the printed circuit board in two directions of displacement (X, Y) transverse to one another, has associated with it, for at least one of the two directions of displacement (X, Y), a respective brake which can be operated as desired or is operated when there is physical contact between the displaceable carrier, the component and the printed circuit board, and that said second carrier displaceable transverse to the plane of the printed circuit board has associated with it, for its displacement direction (Z) transverse to the plane of the printed circuit board is a brake for arresting it in a position in which there is physical contact between the displaceable carrier, the component and the printed circuit boards.

2. An apparatus according to claim 1 wherein the respective brake or brakes can be engaged separately or together by operating a switch, in particular a hand or foot switch.

3. An apparatus according to claim 1 wherein the second carrier for the component can be adjusted in the directions of displacement (X, Y) extending parallel to the plane of the printed circuit board and in the direction of displacement (Z) extending transverse to the plane of the printed circuit board.

4. An apparatus according to claim 1 wherein the displaceable carrier is telescopic transverse to the plane of the printed circuit board and at least one of the brakes effective in the directions of displacement (X, Y) extending parallel to the plane of the printed circuit board is operated by relative displacement of the telescopic parts.

5. An apparatus according to claim 1 wherein said second carrier is arranged on a guide arm which can be displaced parallel to the plane of the printed circuit board by means of a crosshead in a cross guide and wherein the brakes effective in the directions of displacement (X, Y) extending parallel to the plane of the printed circuit board are arranged in the region of the crosshead.

6. An apparatus according to claim 5 wherein the brake effective in the direction of displacement (Y) extending along the guide arm acts between the crosshead and the guide arm.

7. An apparatus according to claim 3 wherein the second carrier is a mounting head with a housing which can be displaced on a guide arm displaceable parallel to the plane of the printed circuit board in a vertical guide, wherein the brake effective in the direction of displacement (Z) extending transverse to the plane of the printed circuit board is arranged in the housing.

8. An apparatus according to claim 1 wherein the brake comprises an electromagnet cooperating with a ferromagnetic surface.

9. An apparatus according to claim 4 wherein the relative displacement between the telescopic parts of the second carrier is determined by an electric switch which contacts the electromagnets.

10. An apparatus according to claim 1 wherein the brake effective in the direction of displacement (Z) extending transverse to the plane of the printed circuit board can be operated by an electric switch.

11. An apparatus according to claim 8 wherein the ferromagnetic surface is formed on a strip or rod-shaped brake element.

12. An apparatus according to claim 11 wherein the electromagnet is arranged underneath the strip or rod-shaped brake element.

13. An apparatus according to claim 11 wherein the strip or rod-shaped brake element is only attached at one end or at both ends to a carrier part.

14. An apparatus according to claim 13 wherein the brake element is attached so that it hangs freely parallel to the plane of the printed circuit board.

15. An apparatus according to claim 11 wherein the brake element comprises two flat bands having arranged between them a damping strip of soft or elastic material.

16. An apparatus according to claim 1 wherein the brake element is a plate-shaped component which is connected to its carrier part by a leaf spring extending parallel to said component.

17. An apparatus according to claim 1 wherein the bottom of the magazine is arranged substantially in the plane of the printed circuit board.

18. An apparatus according to claim 1 wherein at least the brakes effective in the plane of the printed circuit board have movable brake rails extending parallel to the associated direction of displacement (X, Y), each of which is displaceable against the associated moveable guide part in the direction of displacement (X, Y) concerned.

19. An apparatus according to claim 18 wherein brake elements, formed from hard rubber or the like, are arranged between the associated brake rails and guide parts.

20. An apparatus according to claim 19 wherein the displaceable carrier is arranged on a guide arm that is displaceable by means of a crosshead in a cross guide parallel to the plane of the printed circuit board, and wherein the brake cooperating with the guide arm is arranged on an arm that extends substantially parallel to the guide arm and is connected to the crosshead in a vertically flexible manner.

21. An apparatus according to claim 18 wherein the brake rails are arranged to be vertically movable on cross beams arranged transversely between the side walls of the apparatus.

22. An apparatus according to claim 18 wherein the brake rails can be moved by electromagnets arranged at their two ends.

23. An apparatus according to claim 1 wherein the second displaceable carrier is arranged on a guide arm that is displaceable by means of a crosshead in a cross guide parallel to the plane of the printed circuit board and wherein, to guide the cross head, a main guide rail in the form of a rod with two guide planes aligned transversely to one another and an auxiliary guide rail with only one guide plane are provided, said rails extending substantially parallel to a plane longitudinally intersecting the guide rails.

24. An apparatus according to claim 23 wherein the two guide rails are rigidly connected together.

25. An apparatus according to claim 23 wherein pairs of rolls are provided for guidance on the guide rails, of which at least some rolls are mounted on transversely bendable limbs or ribs, preferably weakened by recesses, and that the guidance distance (b, c) of the rolls is adjustable by set screws transversely tensioning the limbs or ribs.

* * * * *